(12) United States Patent
Suh

(10) Patent No.: US 7,732,931 B2
(45) Date of Patent: Jun. 8, 2010

(54) SEMICONDUCTOR PACKAGE AND METHOD FOR MANUFACTURING THE SAME FOR DECREASING NUMBER OF PROCESSES

(75) Inventor: Min Suk Suh, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 9 days.

(21) Appl. No.: 12/044,178

(22) Filed: Mar. 7, 2008

(65) Prior Publication Data

US 2009/0026613 A1    Jan. 29, 2009

(30) Foreign Application Priority Data

Jul. 27, 2007    (KR) ...................... 10-2007-0076020

(51) Int. Cl.
    H01L 23/48    (2006.01)
    H01L 23/52    (2006.01)
    H01L 29/40    (2006.01)
(52) U.S. Cl. ........................ 257/778; 257/733; 257/786; 257/E23.021
(58) Field of Classification Search ................ 257/778, 257/737–738, 773, 774, 782, 786, 730, 731, 257/733, E23.021, E23.069, E21.508
    See application file for complete search history.

(56) References Cited

U.S. PATENT DOCUMENTS 7,321,164 B2 * 1/2008 Hsu ............................ 257/686

2002/0185721 A1    12/2002 Hwang et al.
2004/0041166 A1 *  3/2004 Morrison .................... 257/117

FOREIGN PATENT DOCUMENTS

KR    1020060036881 A    5/2006
KR    1020070104919 A    10/2007

* cited by examiner

Primary Examiner—Ngan Ngo
Assistant Examiner—Dilinh P Nguyen
(74) Attorney, Agent, or Firm—Ladas & Parry LLP

(57) ABSTRACT

A semiconductor package and a method for manufacturing the same. The semiconductor package includes a semiconductor chip having bonding pads; a first insulation layer pattern; redistribution line patterns; a second insulation layer pattern; and conductive balls. The first insulation layer pattern having first openings exposing the bonding pads. The redistribution line patterns are located on the first insulation layer pattern and are electrically connected with the bonding pads. The second insulation layer pattern covering the redistribution line patterns and having second openings having first open areas which expose portions of the redistribution line patterns and having second open areas which extend from the first open areas along the semiconductor chip. The conductive balls are electrically connected with the portions of the redistribution line patterns which are exposed through the first open areas of the second insulation layer pattern.

9 Claims, 11 Drawing Sheets

SEMICONDUCTOR PACKAGE AND METHOD FOR MANUFACTURING THE SAME FOR DECREASING NUMBER OF PROCESSES

CROSS-REFERENCE TO RELATED APPLICATIONS

The present application claims priority to Korean patent application number 10-2007-0076020 filed on Jul. 27, 2007, which is incorporated herein by reference in its entirety.

BACKGROUND OF THE INVENTION

The present invention relates to a semiconductor package and a method for manufacturing the same.

These days, semiconductor packages capable of storing a large amount of data and processing stored data in a short amount of time is well known in the art.

Semiconductor packages are manufactured first through a semiconductor chip manufacturing process that integrates elements such as transistors, resistors and capacitors in a wafer for forming semiconductor chips. Second, semiconductor packages are manufactured through a packaging process for parting the semiconductor chips from the wafer, for electrically connecting the semiconductor chips with outside circuit boards, etc. and for protecting the semiconductor chips having inferior strength from externally applied shocks and/or vibrations.

Recently, as the packaging technologies are developed, a wafer level package, which has a size no greater than 100% to 105% of the size of a semiconductor chip, and a stacked semiconductor package, in which a plurality of semiconductor chips or a plurality of semiconductor packages are stacked, have been disclosed in the art.

The wafer level package provides advantages in that it has reduced volume and weight and can process data at a high speed.

In general, the wafer level package has redistribution line patterns which are connected with the bonding pads of a semiconductor chip, and includes an insulation layer which has openings for exposing portions of the redistribution line patterns. Solder balls or the likes are attached to the redistribution line patterns which are exposed through the openings of the insulation layer.

However, when manufacturing the wafer level package, in order to form the insulation layer having the openings for exposing the redistribution line patterns, it is necessary to implement a coating process for forming an insulation layer containing a photoresist material on a wafer, a lithographic process for exposing the insulation layer, and a development process for patterning the exposed insulation layer. As a result, a problem is caused in that the number of processes for manufacturing the wafer level package markedly increases.

SUMMARY OF THE INVENTION

Embodiments of the present invention are directed to a semiconductor package which can be manufactured through a significantly decreased number of processes.

Also, embodiments of the present invention are directed to a method for manufacturing the semiconductor package.

One embodiment of the semiconductor package of the present invention comprises a semiconductor chip having bonding pads; a first insulation layer pattern having first openings exposing the bonding pads; redistribution line patterns located on the first insulation layer pattern and electrically connected with the bonding pads; a second insulation layer pattern covering the redistribution line patterns and having second openings which have first open areas exposing portions of the redistribution line patterns and second open areas extending from the first open areas along the semiconductor chip; and conductive balls electrically connected with the portions of the redistribution line patterns which are exposed through the first open areas of the second insulation layer pattern.

Each of the redistribution line patterns includes a pattern body connected with each bonding pad and a pad part formed on an end of the pattern body, and each of the first opening areas exposes the pad part.

The pad part has the shape of a disc, and the first open area is defined to have a circular shape and exposes a center portion of the pad part.

The second open area is defined in a direction which is substantially perpendicular to the pattern body.

The second open area has the shape of a slit when viewed from the top.

Each of the first openings has first opening regions which expose the bonding pads and second opening regions which extend from the first opening regions toward an edge of the semiconductor chip. The second opening regions have the shape of a slit when viewed from the top.

In an embodiment of a method of the present invention for manufacturing a semiconductor package, the method comprises the steps of forming a semiconductor chip having a passivation layer pattern which expose bonding pads; forming a first insulation layer pattern on the passivation layer pattern, the first insulation layer pattern having first openings which expose the bonding pads; forming redistribution line patterns on the first insulation layer pattern in which the redistribution line patterns are electrically connected with the bonding pads; forming a second insulation layer pattern covering the redistribution line patterns and having second openings which have first open areas which expose portions of the redistribution line patterns and second open areas which extend from the first open areas along the semiconductor chip; and connecting conductive balls to the portions of the redistribution line patterns which are exposed through the first open areas of the second insulation layer pattern.

The step of forming the first insulation layer pattern comprises the steps of: arranging a pattern mask on the passivation layer pattern, the pattern mask having a mask body which has an opening exposing the entire passivation layer pattern, cover parts which cover the respective bonding pads, and connection parts which connect the cover parts; applying an insulation material onto the passivation layer pattern using the pattern mask; and removing the pattern mask from the passivation layer pattern and forming the first insulation layer pattern which has first open regions corresponding to the cover parts and second open regions corresponding to the connection parts.

In the step of applying the insulation material, the insulation material is applied onto the passivation layer pattern using a scraper. In the step of applying the insulation material, the insulation material is applied onto the passivation layer pattern through spraying.

The step of forming the second insulation layer pattern comprises the steps of arranging a pattern mask on the first insulation layer pattern, the pattern mask having a mask body which has an opening exposing the entire first insulation layer pattern, cover parts which cover the portions of the redistribution line patterns, and connection parts which connect the cover parts; applying an insulation material onto the first insulation layer pattern using the pattern mask; and removing the pattern mask from the first insulation layer pattern and forming the second insulation layer pattern which has the first open areas corresponding to the cover parts and the second open areas corresponding to the connection parts.

In the step of applying the insulation material, the insulation material is applied onto the first insulation layer pattern using a scraper.

In the step of applying the insulation material, the insulation material is applied onto the first insulation layer pattern through spraying.

DESCRIPTION OF SPECIFIC EMBODIMENTS

Figure 1:
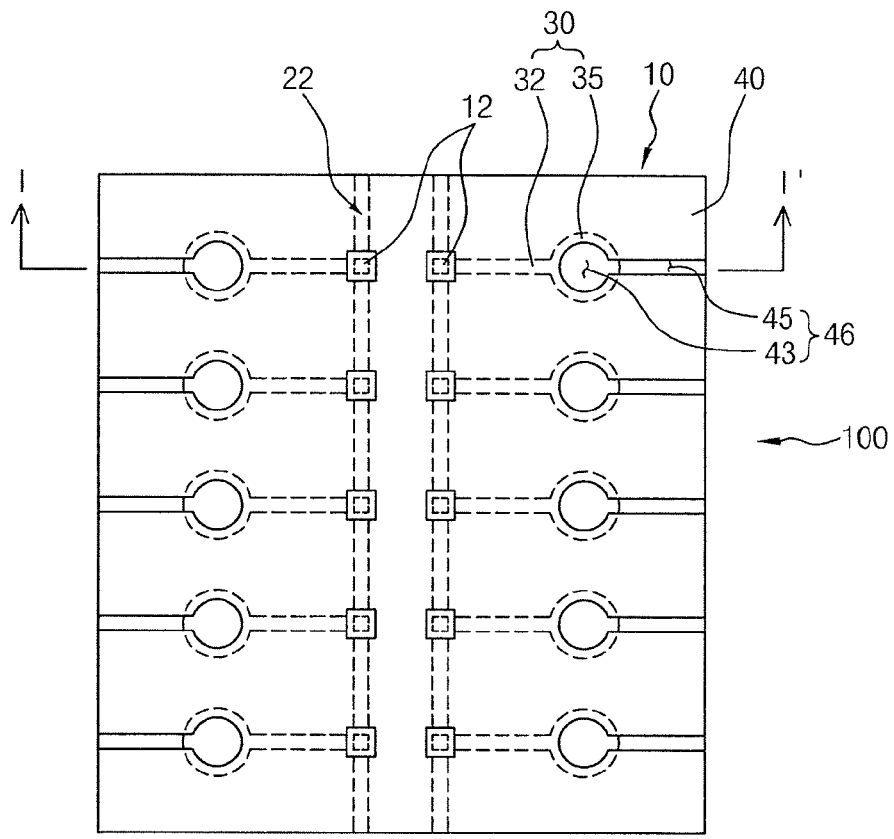
FIG. 1 is a plan view illustrating a semiconductor package in accordance with an embodiment of the present invention.
Figure 2:
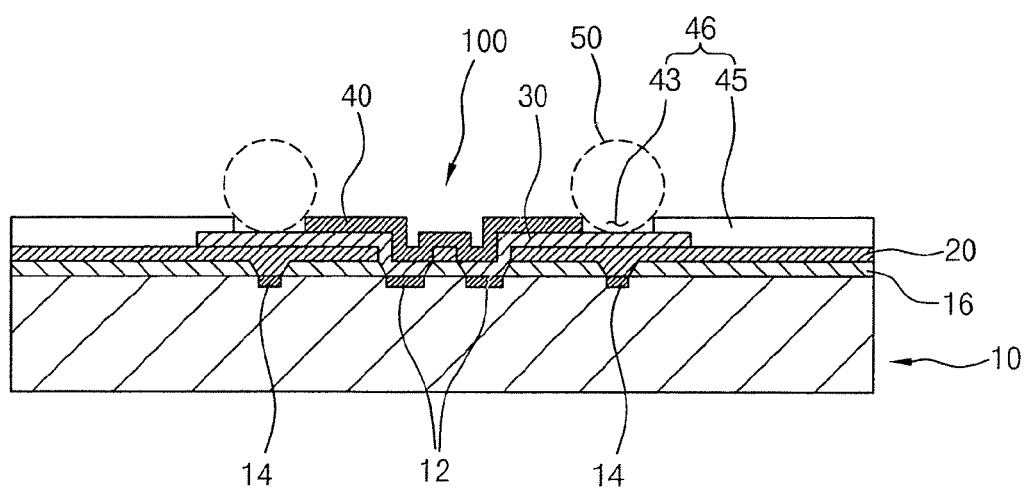
FIG. 2 is a cross-sectional view taken along the line I-I' of FIG. 1.

FIG. 1 is a plan view illustrating a semiconductor package in accordance with an embodiment of the present invention. FIG. 2 is a cross-sectional view taken along the line I-I' of FIG. 1.

Referring to FIGS. 1 and 2, a semiconductor package 100 includes a semiconductor chip 10, a first insulation layer pattern 20, redistribution line patterns 30, a second insulation layer pattern 40, and conductive balls 50.

Figure 3:
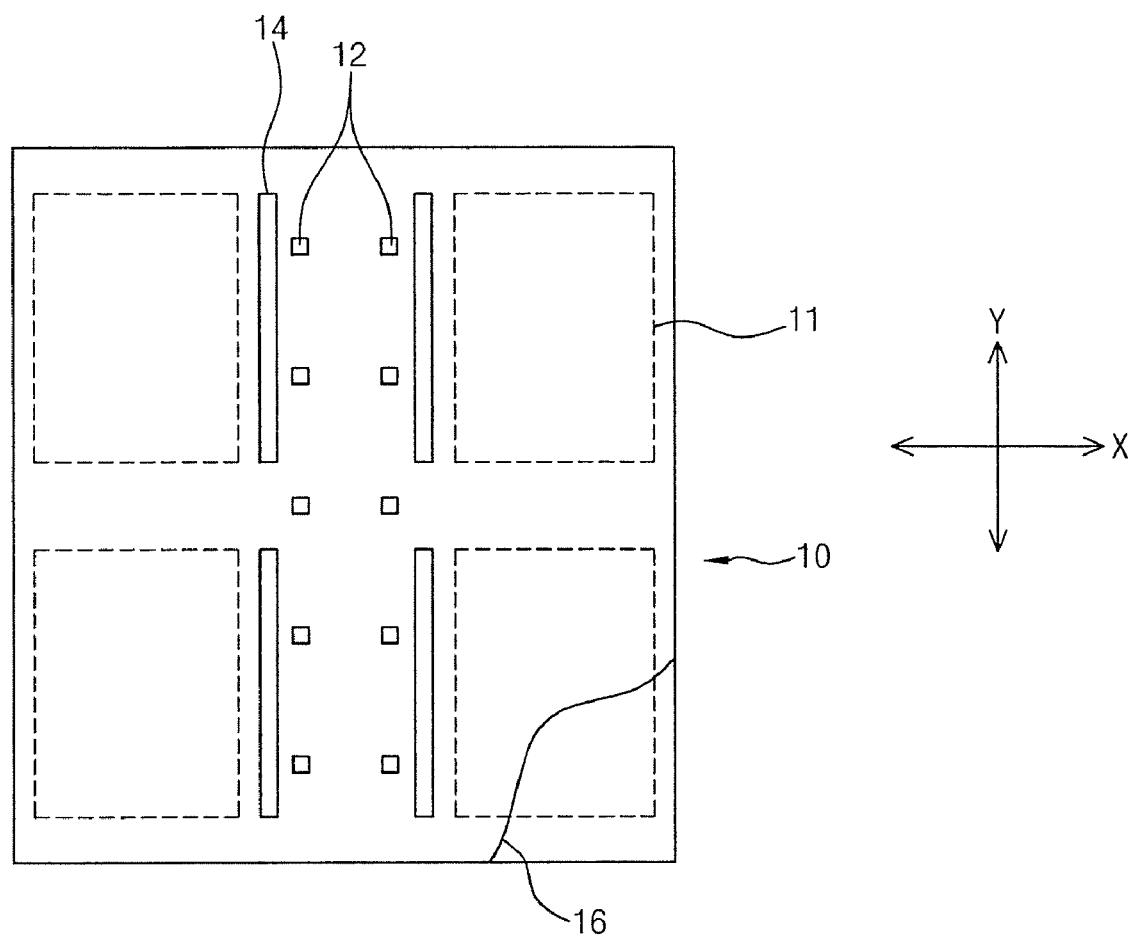
FIG. 3 is a plan view illustrating the semiconductor chip shown in FIG. 1.

FIG. 3 is a plan view illustrating the semiconductor chip shown in FIG. 1.

Referring to FIGS. 2 and 3, the semiconductor chip 10 has data storage sections 11 for storing data, data processing sections (not shown) for processing data, and bonding pads 12.

The data storage sections 11 are located inside the semiconductor chip 10, for example, in the shape of a 2 by 2 matrix, and the bonding pads 12 are located between the data storage sections 11. The bonding pads 12 are located, for example, in two rows along the Y-axis in FIG. 3. The bonding pads 12 are electrically connected with the data storage sections 11 and/or the data processing sections.

In addition, the semiconductor chip 10 can have fuse boxes 14 and a passivation layer pattern 16. The fuse boxes 14 include fuses for repairing the data storage sections 11 and are interposed between the bonding pads 12 and the data storage sections 11. The passivation layer pattern 16 includes a nitride layer and/or an oxide layer and has openings which expose the bonding pads 12 and the fuse boxes 14.

Figure 4:
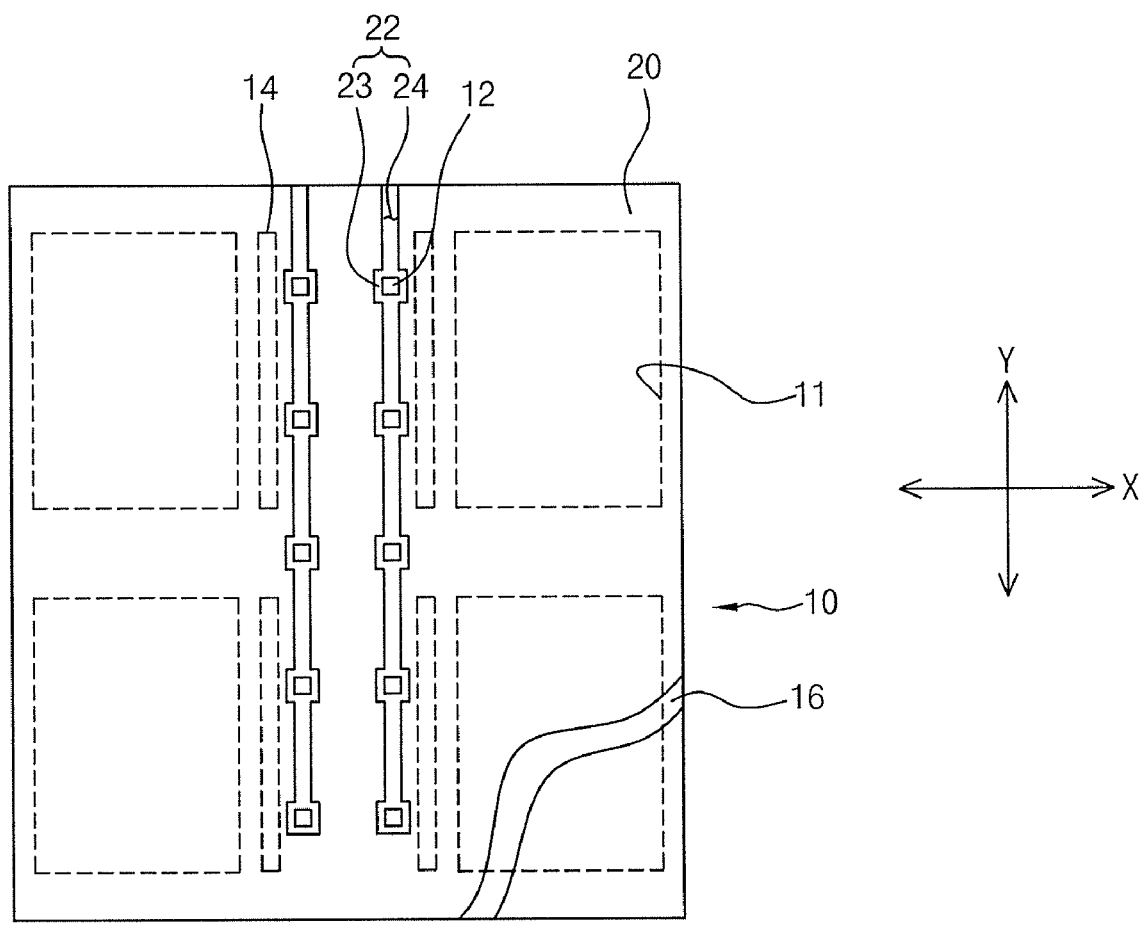
FIG. 4 is a plan view illustrating the first insulation layer pattern shown in FIG. 2.

FIG. 4 is a plan view illustrating the first insulation layer pattern shown in FIG. 2.

Referring to FIGS. 2 and 4, the first insulation layer pattern 20 is located on the passivation layer pattern 16. The first insulation layer pattern 20 can, for example, be an organic layer. The first insulation layer pattern 20 has first openings 22.

Each of the first openings 22 has first open regions 23 and second open regions 24. The first open regions 23 expose the respective bonding pads 12 of the semiconductor chip 10, and the second open regions 24 connect the first open regions 23 along the Y-axis. The second open regions 24 extend from the first open regions 23 to the edges of the semiconductor chip 10.

Figure 5:
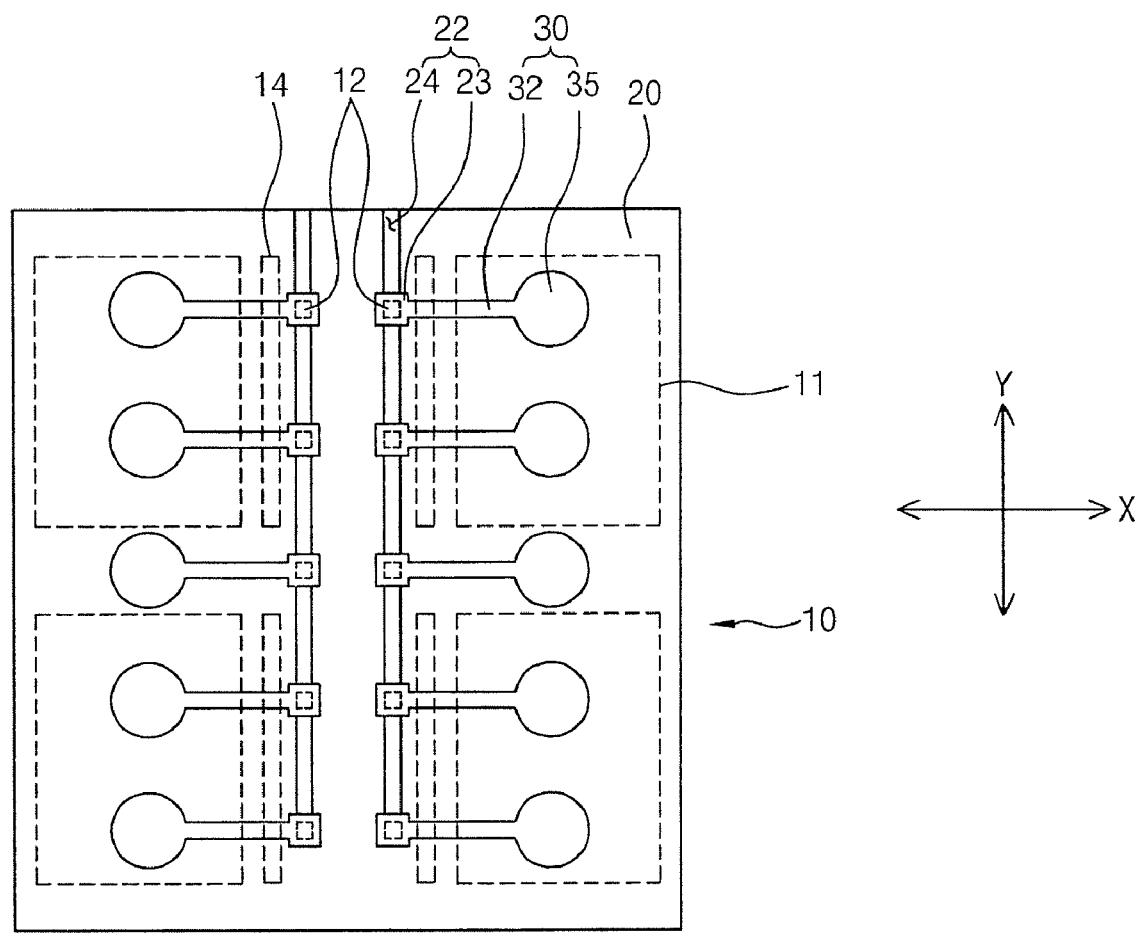
FIG. 5 is a plan view illustrating the redistribution line patterns shown in FIG. 2.

FIG. 5 is a plan view illustrating the redistribution line patterns shown in FIG. 2.

Referring to FIGS. 2 and 5, the redistribution line patterns 30 are located on the first insulation layer pattern 20. One end of each of the redistribution line patterns 30 is electrically connected with each of the bonding pads 12 which are exposed through the first open regions 23 defined in the first insulation layer pattern 20. The other end of each of the redistribution line patterns 30, which faces away from the one end, for example, extends from the one end toward the edge of the semiconductor chip 10 on the first insulation layer pattern 20.

Each redistribution line pattern 30 has a pattern body 32 and a pad part 35. One end of the pattern body 32 is electrically connected with the bonding pad 12, and the pad part 35 is located on the other end of the pattern body 32 which faces away from the one end of the pattern body 32. The pattern body 32 can have the shape of a line when viewed from the top. The pad part 35 can have a shape of a disc when viewed from the top. In the present embodiment, in each redistribution line pattern 30, the pattern body 32 having the shape of a line and the pad part 35 having the shape of a disc are integrally formed with each other.

Referring again to FIG. 1, the second insulation layer pattern 40 is located over the first insulation layer pattern 20 and covers the redistribution line patterns 30. The second insulation layer pattern 40 can be an organic layer.

The second insulation layer pattern 40 has second openings 46.

Each of the second openings 46 has a first open area 43 and a second open area 45. The first open area 43 selectively exposes the pad part 35 of the redistribution line pattern 30, and the second open area 45, for example, extends from the first open area 43 to the edge of the semiconductor chip 10 along the X-axis. In order to prevent the pattern body 32 of the redistribution line pattern 30 from being exposed through the second open area 45, the second open area 45 and the pattern body 32 are located in opposite positions.

In the present embodiment, the first open area 43 can have a circular shape when viewed from the top, and the second open area 45 can have the shape of a slit when viewed from the top. The first open area 43 has, for example, a size that exposes at least a portion of the pad part 35.

Referring again to FIG. 2, the conductive balls 50 are electrically connected with the respective pad parts 35 of the redistribution line patterns 30, which are exposed through the first open areas 43 of the second insulation layer pattern 40. In the present embodiment, the conductive balls 50 can, for example, be solder balls containing solder.

FIGS. 6 through 12 are plan views and cross-sectional views illustrating a method for manufacturing a semiconductor package in accordance with another embodiment of the present invention.

Figure 6:
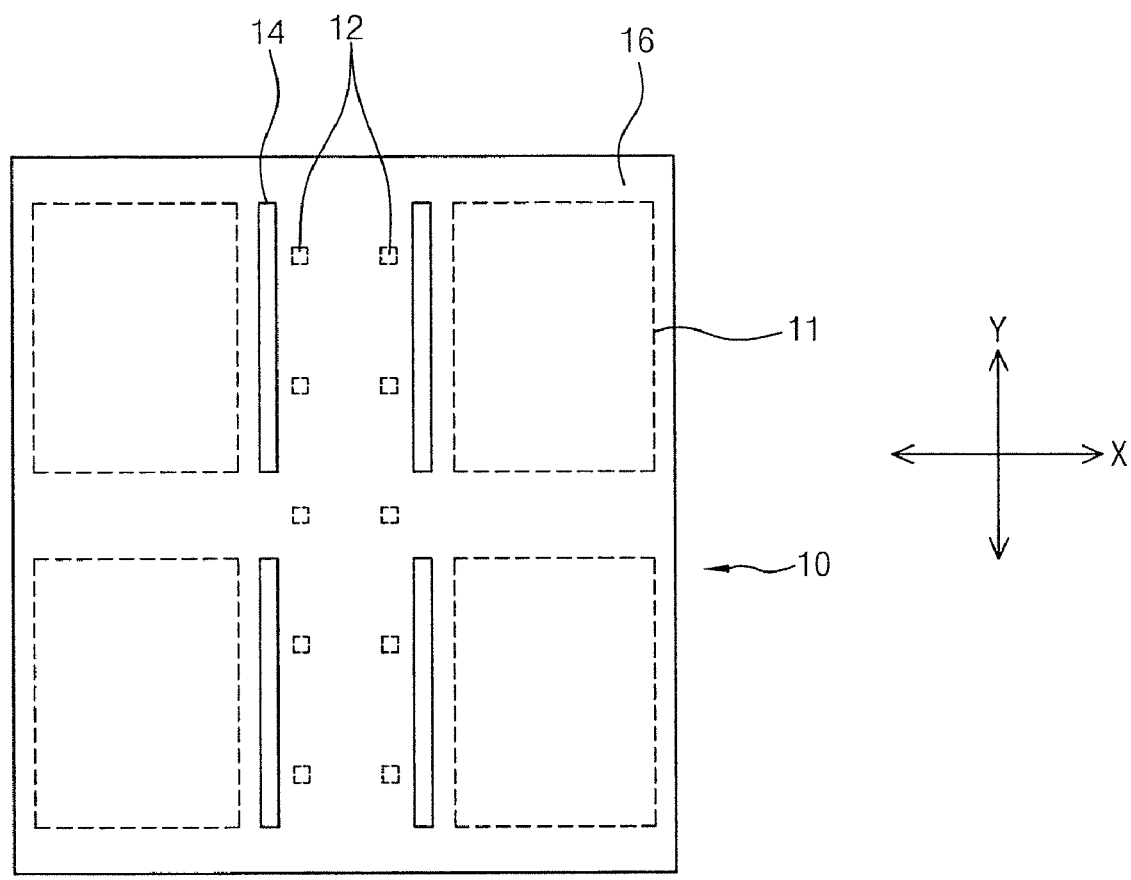
FIGS. 6 through 12 are plan views and cross-sectional views illustrating a method for manufacturing a semiconductor package in accordance with another embodiment of the present invention.

Referring to FIG. 6, in order to manufacture a semiconductor package, a semiconductor chip 10 having bonding pads 12 and a passivation layer pattern 16 is manufactured. The semiconductor chip 10 can include fuse boxes 14 which have fuses for repairing data storage sections 11.

Figure 7:
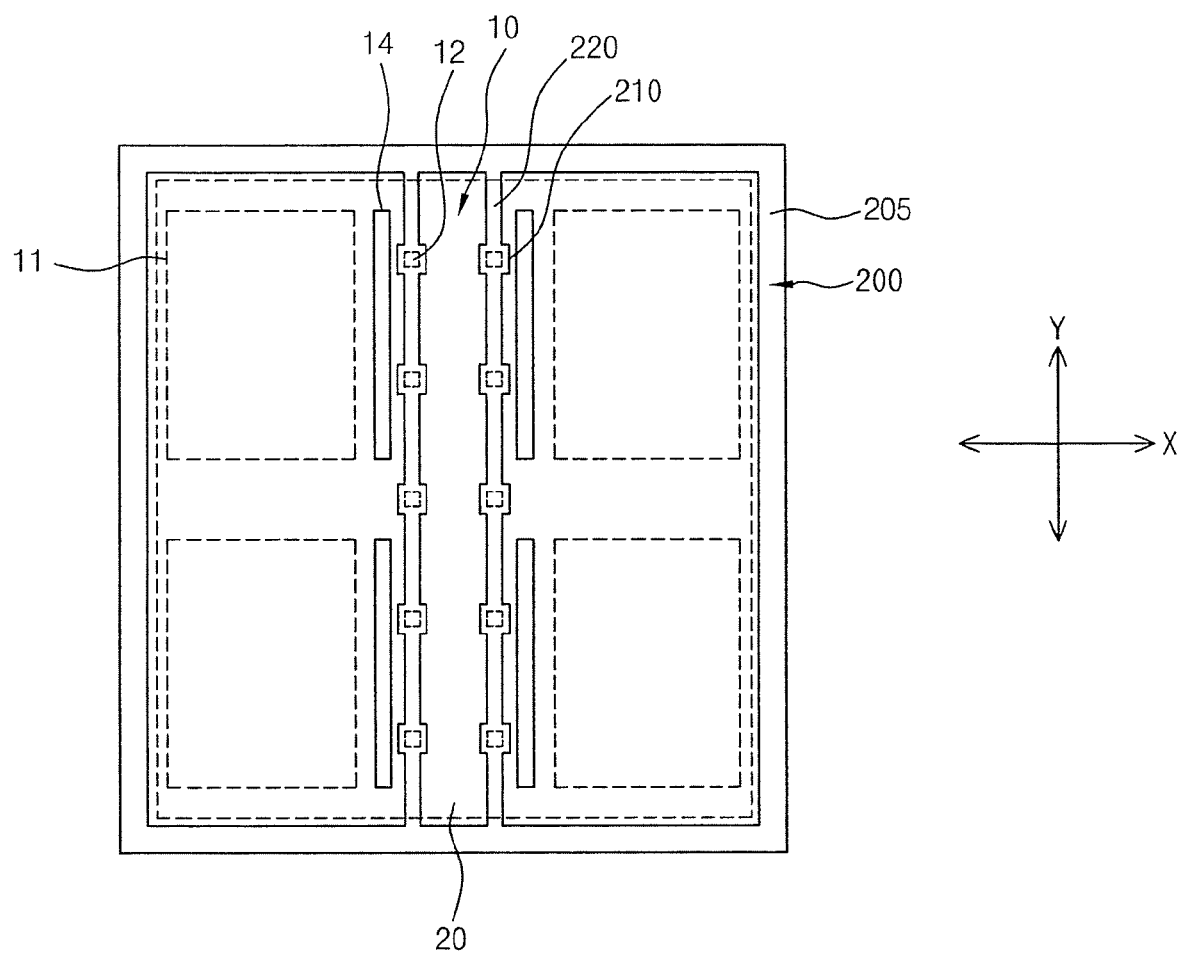
Figure 8:
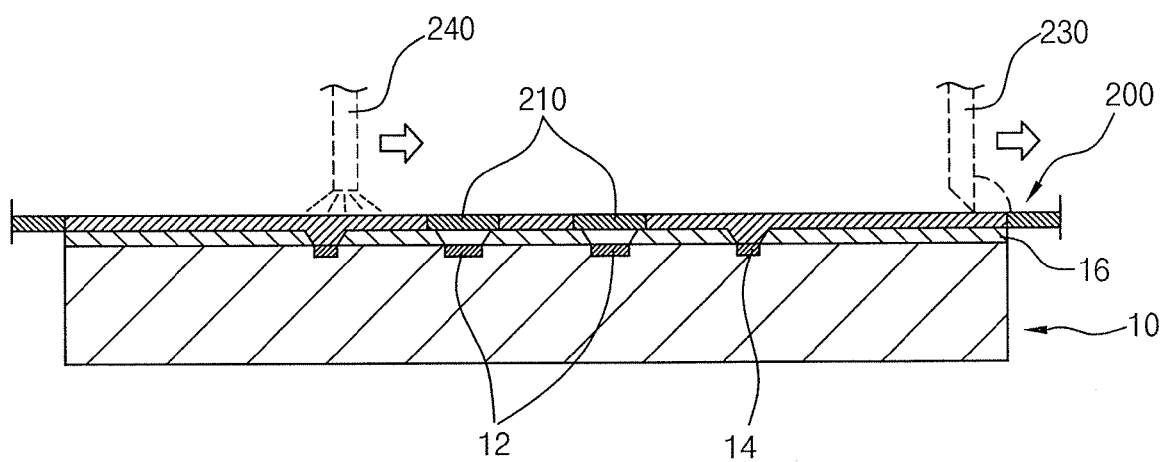

Referring to FIG. 7, after the semiconductor chip 10 having the bonding pads 12, the passivation layer pattern 16 and the fuse boxes 14 is manufactured, a first insulation layer pattern 20 is formed on the passivation layer pattern 16 without implementing a photo process such that the fuse boxes 14 are covered and the bonding pads 12 are exposed.

In order to form the first insulation layer pattern 20, a first pattern mask 200 is arranged on the semiconductor chip 10.

The first pattern mask 200 for forming the first insulation layer pattern 20 has a first mask body 205, first cover parts 210, and first connection parts 220.

The first mask body 205 has the shape of a quadrangular frame which has an opening for exposing the entire surface of the passivation layer pattern 16 of the semiconductor chip 10. The first cover parts 210 cover the respective bonding pads 12, and the first connection parts 220 connect the first cover parts 210. In the present embodiment, the first connection parts 220 have the shape of a line when viewed from the top.

Figure 9:
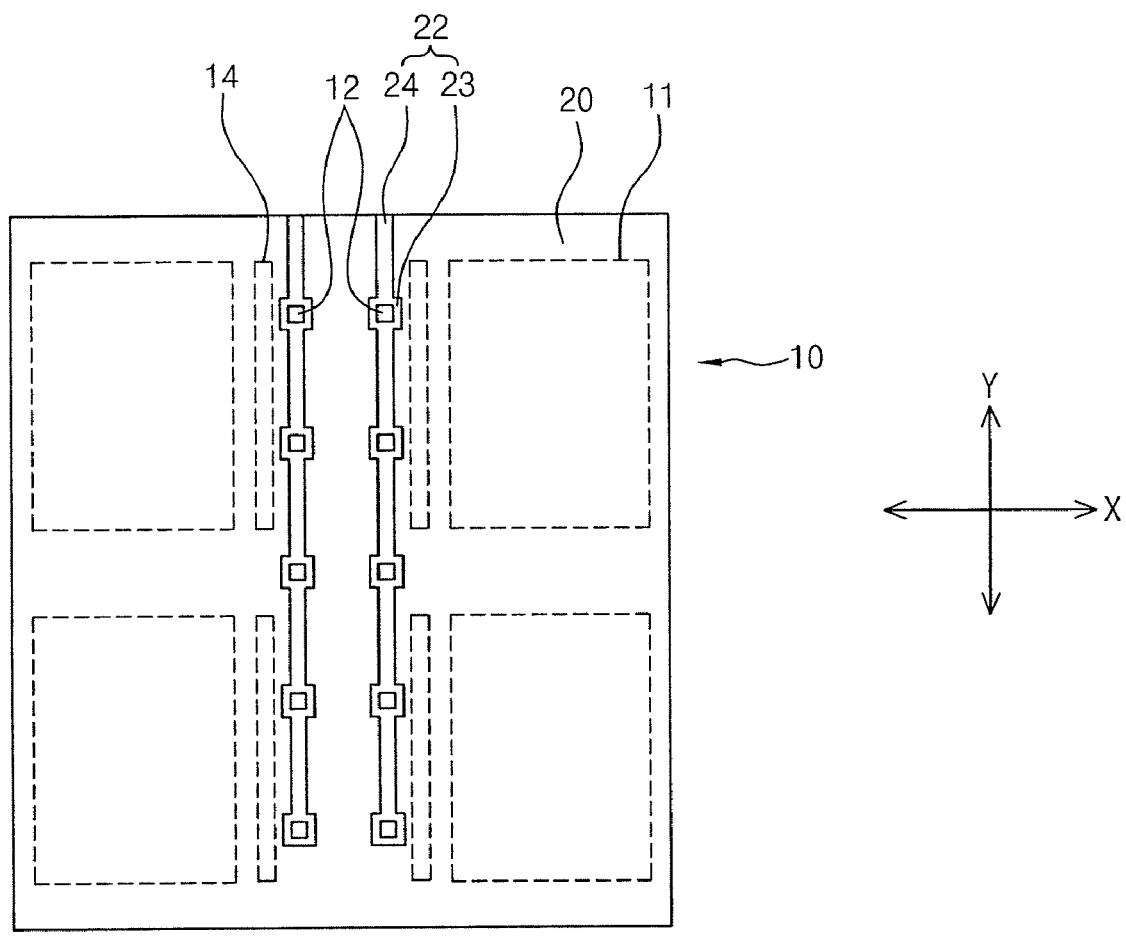

After the first pattern mask 200 is arranged on the semiconductor chip 10, by applying an insulation material on the passivation layer pattern 16 using the first pattern mask 200 and then removing the first pattern mask 200 from the passivation layer pattern 16, the first insulation layer pattern 20, which exposes the bonding pads 12, is formed on the passivation layer pattern 16 as shown in FIG. 9 without implementing a photo process.

In the present embodiment, the insulation material can be applied onto the passivation layer pattern 16 by a screen printing method using a scraper 230. Unlike this, the insulation material can be applied onto the passivation layer pattern 16 by a spraying method using an injection unit 240.

Figure 10:
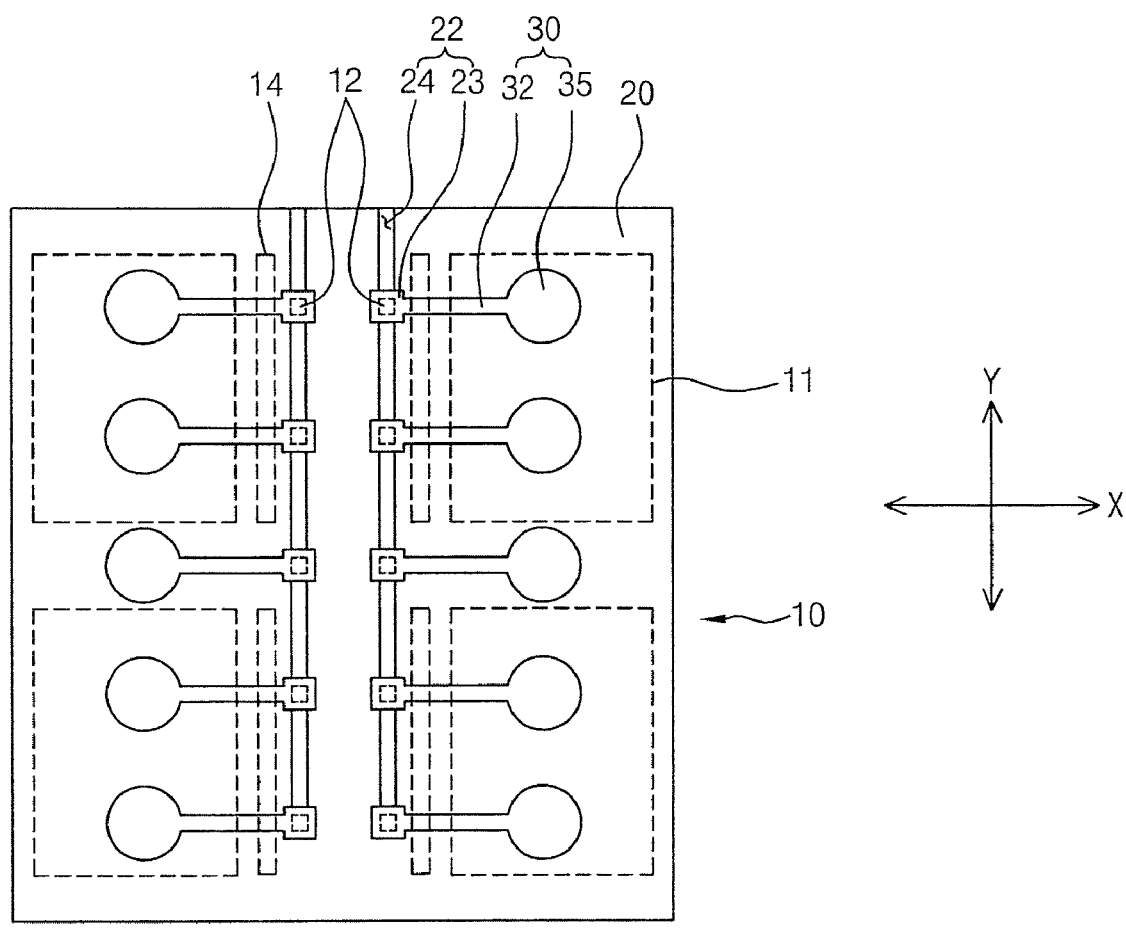

Referring to FIG. 10, after the first insulation layer pattern 20 is formed, redistribution line patterns 30 are formed on the first insulation layer pattern 20.

In order to form the redistribution line patterns 30, a metal layer (not shown) is formed on the entire area of the first insulation layer pattern 20. The metal layer can be formed through a chemical vapor deposition process or a sputtering process.

After the metal layer is formed, a photoresist film (not shown) is formed on the metal layer. The photoresist film can be formed, for example, through a spin coating process.

The photoresist film is patterned through a photo process including a lithographic process and a development process, by which a photoresist pattern is formed on the metal layer.

The metal layer is patterned using the photoresist pattern, and thereby, the redistribution line patterns 30 are formed on the first insulation layer pattern 20.

Each of the redistribution line patterns 30 formed on the first insulation layer pattern 20 has a pattern body 32 and a pad part 35. One end of the pattern body 32 is electrically connected with the bonding pad 12, and the pad part 35 is integrally formed with the other end of the pattern body 32, which faces away from the one end of the pattern body 32. In the present embodiment, the pattern body 32 is formed to have the shape of, for example, a line, and the pad part 35 is formed to have the shape of, for example, a disc.

Figure 11:
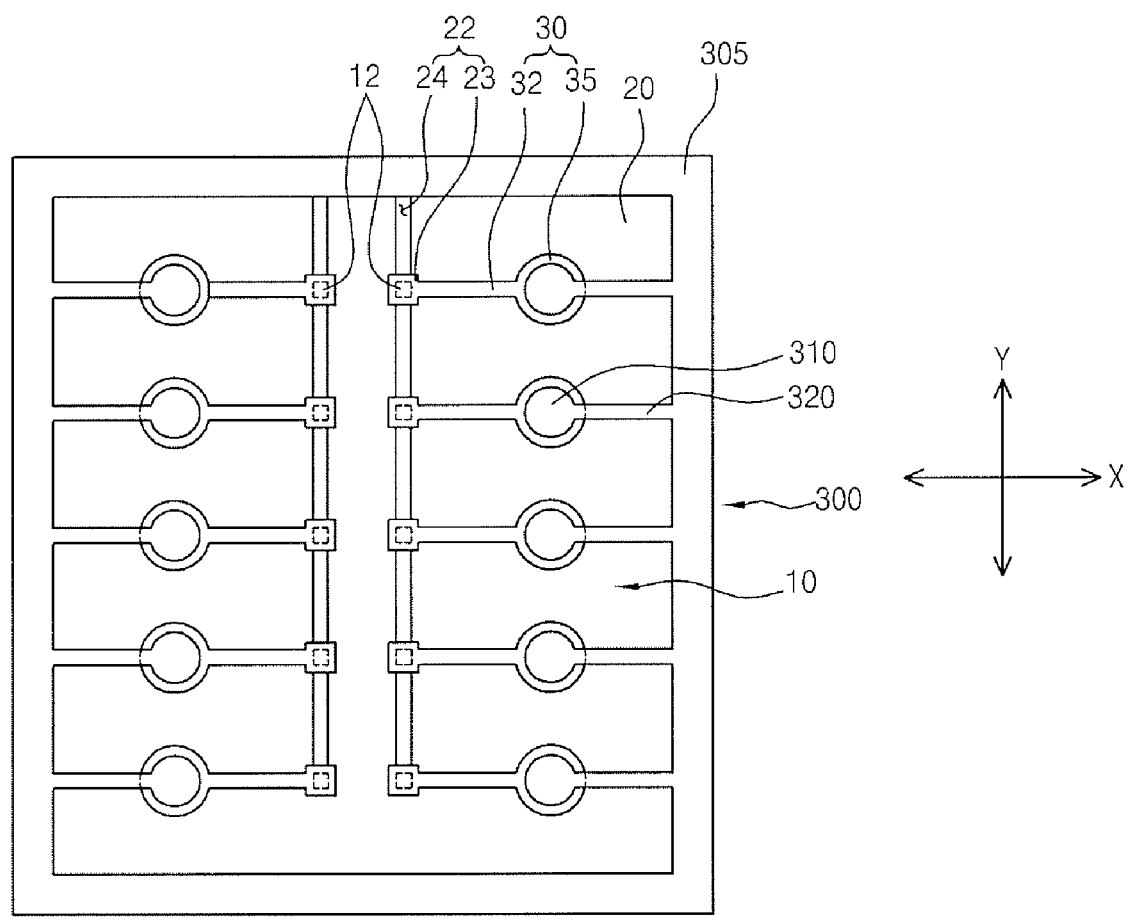

Referring to FIG. 11, after the redistribution line patterns 30 are formed, a second pattern mask 300 is arranged on the first insulation layer pattern 20.

The second pattern mask 300 has a second mask body 305, second cover parts 310 and second connection parts 320.

The second mask body 305 has the shape of a quadrangular frame which has an opening for exposing at least a portion, preferably, the entire area of the first insulation layer pattern 20 of the semiconductor chip 10. The second cover parts 310 cover the respective pad parts 35 of the redistribution line patterns 30, and the second connection parts 320 connect the second cover parts 310. In the present embodiment, the second connection parts 320 have the shape of a line when viewed from the top.

Figure 12:
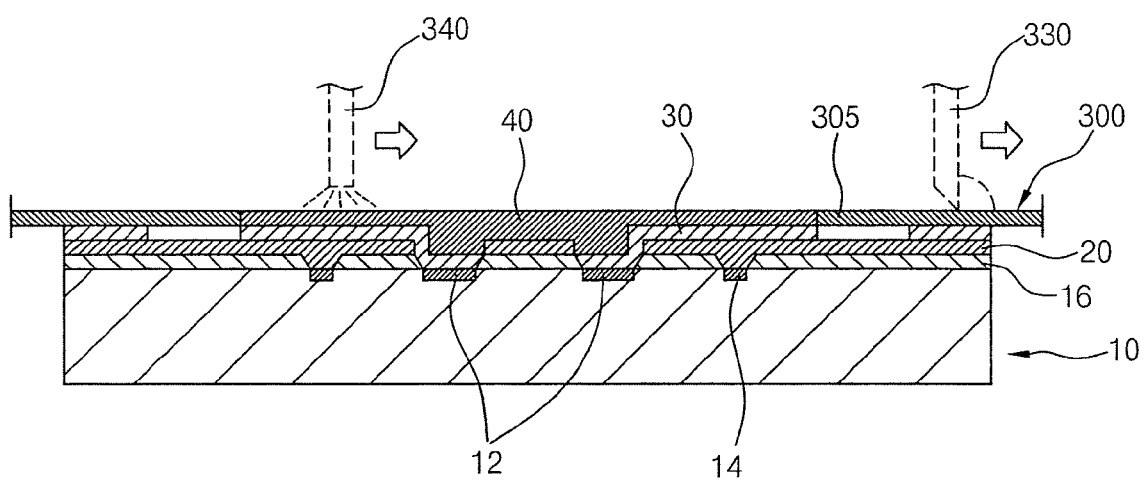

After the second pattern mask 300 is arranged on the semiconductor chip 10, by applying an insulation material on the first insulation layer pattern 20 using the second pattern mask 300 and then removing the second pattern mask 300 from the first insulation layer pattern 20, the second insulation layer pattern 40, which exposes the pad parts 35 of the redistribution line patterns 30, is formed on the first insulation layer pattern 20 as shown in FIG. 12 without implementing a photo process.

In the present embodiment, the insulation material can be applied onto the first insulation layer pattern 20 by a screen printing method using a scraper 330. Unlike this, the insulation material can be applied onto the first insulation layer pattern 20 by a spraying method using an injection unit 340.

Referring again to FIG. 2, the second insulation layer pattern 40 has first open areas 43 which are defined by the second cover parts 310 of the second pattern mask 300 and expose the pad parts 35 of the redistribution line patterns 30, and second open areas 45 which are defined by the second connection parts 320 of the second pattern mask 300 and extend from the first open areas 43 to the edges of the semiconductor chip 10.

After the second insulation layer pattern 40 having the first and second open areas 43 and 45 is formed, conductive balls 50 such as solder balls are attached to the pad parts 35 of the redistribution line patterns 30, which are exposed through the first open areas 43, whereby the manufacture of the semiconductor package 100 is completed.

As is apparent from the above description, in the present invention, since processes for forming an insulation layer pattern to be used for forming redistribution line patterns connected with the bonding pads of a semiconductor chip and an insulation layer pattern to be used for insulating the redistribution line patterns can be simplified, the number of processes for manufacturing a semiconductor package can be significantly decreased.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
   a semiconductor chip having bonding pads;
   a first insulation layer pattern having first openings exposing the bonding pads;
   redistribution line patterns located on the first insulation layer pattern and electrically connected with the bonding pads;
   a second insulation layer pattern covering the redistribution line patterns and having second openings which have first open areas exposing portions of the redistribution line patterns and second open areas extending away from the first open areas to edges of the semiconductor chip, wherein the second open areas expose portions of the first insulation layer pattern; and
   conductive balls electrically connected with the portions of the redistribution line patterns which are exposed through the first open areas of the second insulation layer pattern.

2. The semiconductor package according to claim 1, wherein each redistribution line pattern includes a pattern body connected with one of the bonding pads and a pad part formed on an end of the pattern body, and one of the first opening areas exposing the pad part.

3. The semiconductor package according to claim 2, wherein the pad part having a disc shape, and each first open area having a circular shape and exposing a center portion of the pad part.

4. The semiconductor package according to claim 2, wherein each second open area having a direction which is substantially perpendicular to the pattern body.

5. The semiconductor package according to claim 2, wherein the second open areas extend from the first open areas along a portion of the semiconductor chip opposite to a portion of the semiconductor chip on which the pattern bodies extend such that at least a portion of the second open areas does not overlap the redistribution line patterns.

6. The semiconductor package according to claim 1, wherein each second open area having a slit shape when viewed from the top.

7. The semiconductor package according to claim 1, wherein each first opening having a first open region exposing one of the bonding pads and a second open region extending from the first open region toward an edge of the semiconductor chip.

8. The semiconductor package according to claim 7, wherein each second open region having a slit shape when viewed from the top.

9. The semiconductor package according to claim 1, wherein the second open areas extend from the first open areas and along a portion of the semiconductor chip not overlapping the redistribution line to edges of the semiconductor chip.

* * * * *